(12) United States Patent
Mitani et al.

(10) Patent No.: US 8,575,722 B2
(45) Date of Patent: Nov. 5, 2013

(54) SEMICONDUCTOR SUBSTRATE HAVING MULTILAYER FILM AND METHOD TO REUSE THE SUBSTRATE BY DELAMINATING A POROUS LAYER

(75) Inventors: Kiyoshi Mitani, Annaka (JP); Tsuyoshi Ohtsuki, Annaka (JP); Toru Takahashi, Annaka (JP); Wei Feig Qu, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/142,544

(22) PCT Filed: Dec. 8, 2009

(86) PCT No.: PCT/JP2009/006680
§ 371 (c)(1),
(2), (4) Date: Jun. 28, 2011

(87) PCT Pub. No.: WO2010/089832
PCT Pub. Date: Aug. 12, 2010

(65) Prior Publication Data
US 2011/0266655 A1   Nov. 3, 2011

(30) Foreign Application Priority Data
Feb. 5, 2009   (JP) .................. 2009-025300

(51) Int. Cl.
*H01L 29/06* (2006.01)
*H01L 21/46* (2006.01)
*H01L 21/00* (2006.01)

(52) U.S. Cl.
USPC ............ 257/618; 438/458; 438/459; 438/480

(58) Field of Classification Search
USPC ..................... 257/618; 438/459, 458, 480
See application file for complete search history.

(56) References Cited

U.S. PATENT DOCUMENTS 6,251,754 B1 * 6/2001 Ohshima et al. .............. 438/506
7,008,860 B2 * 3/2006 Kakizaki et al. .............. 438/459

(Continued)

FOREIGN PATENT DOCUMENTS

EP  0 706 203 A1  4/1996
JP  A-8-139297  5/1996

(Continued)

OTHER PUBLICATIONS

Sep. 13, 2011 International Preliminary Report on Patentability issued for International Application No. PCT/JP2009/006680.

(Continued)

*Primary Examiner* — Long K Tran
*Assistant Examiner* — Dzung Tran
(74) *Attorney, Agent, or Firm* — Oliff & Berridge, PLC

(57) ABSTRACT

A method for producing a semiconductor wafer having a multilayer film, in production of a semiconductor device by the steps of forming a porous layer on a surface of a semiconductor wafer by changing a surface portion into the porous layer, forming a semiconductor film on a surface of the porous layer to produce a semiconductor wafer having a multilayer film, fabricating a device on the semiconductor film, and producing the semiconductor device by delaminating the semiconductor film along the porous layer, the semiconductor film having the device formed thereon, including flattening the semiconductor wafer after delaminating and reusing the flattened semiconductor wafer, the method further including a thickness adjusting step of adjusting a whole thickness of the semiconductor wafer having a multilayer film to be produced by reusing the semiconductor wafer so as to satisfy a predetermined standard.

5 Claims, 6 Drawing Sheets

(56) References Cited

U.S. PATENT DOCUMENTS

| | | | |
|---|---|---|---|
| 2003/0087503 A1* | 5/2003 | Sakaguchi et al. | 438/406 |
| 2004/0185638 A1 | 9/2004 | Kakizaki et al. | |
| 2004/0219762 A1* | 11/2004 | Shimoda et al. | 438/455 |
| 2004/0248380 A1 | 12/2004 | Aulnette et al. | |
| 2004/0259326 A1* | 12/2004 | Hideo | 438/458 |
| 2005/0059219 A1* | 3/2005 | Tayanaka | 438/458 |

FOREIGN PATENT DOCUMENTS

| | | |
|---|---|---|
| JP | A-9-312349 | 12/1997 |
| JP | A-2003-78117 | 3/2003 |
| JP | A-2009-247610 | 9/2004 |
| JP | A-2004-311955 | 11/2004 |
| JP | A-2005-191458 | 7/2005 |
| JP | A-2006-527479 | 11/2006 |

OTHER PUBLICATIONS

International Search Report mailed Mar. 9, 2010 issued in International Patent Application No. PCT/JP2009/006680 (with translation).

Feb. 19, 2013 Office Action issued in Japanese Patent Application No. 2009-025300 (with partial translation).

Jul. 16, 2013 Office Action issued in Japanese Patent Application No. 2009-025300 (with translation).

* cited by examiner

FIG. 2
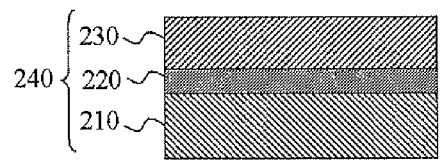
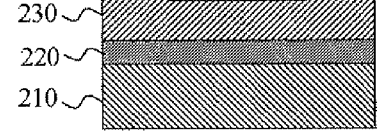
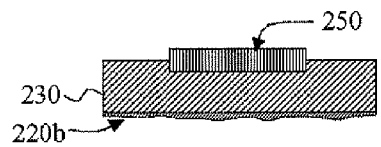
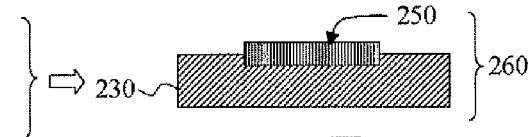
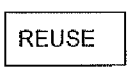
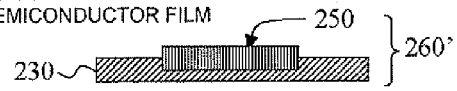

SEMICONDUCTOR SUBSTRATE HAVING MULTILAYER FILM AND METHOD TO REUSE THE SUBSTRATE BY DELAMINATING A POROUS LAYER

TECHNICAL FIELD

The present invention relates to a semiconductor wafer having a multilayer film, which has a porous layer and a semiconductor film on a semiconductor wafer, a method for producing it, and a method for producing a semiconductor device by using the semiconductor wafer having a multilayer film.

BACKGROUND ART

As a method for producing a thin film semiconductor device used for IC cards and the like, there is disclosed, in Patent Literature 1, a method for forming a porous layer on the surface of a semiconductor wafer, producing a wafer having a semiconductor film, which is to be an area for forming a device, formed on the surface of the porous layer and forming the thin film semiconductor device by delaminating the wafer along the porous layer after forming the device on the semiconductor film.

According to this method, since the semiconductor wafer is thinned by the delamination, it is not necessary that a back surface side (the opposite side to the surface on the side of forming the device) of the semiconductor wafer after forming the device is removed by grinding, polishing, and the like, unlike a conventional method. As a result, less material loss is incurred, wastes such as cutting chips can be reduced, and thus an environmental advantage can be obtained. Moreover, the number of production wafers to be used can be reduced by reusing the semiconductor wafer after the delamination, and accordingly advantage of the reduction in production cost is greatly expected.

However, when the semiconductor wafer is reused, it is delaminated (separated) along the porous layer, and a minute break or chip is thereby generated on the delaminated surface (separated surface). It is consequently necessary to remove the porous layer having this delaminated surface completely and to form the porous layer again. Therefore, there arises a problem that the thickness of the wafer is thinned by at least an amount corresponding to the thickness of the porous layer whenever the wafer is reclaimed.

In the event that the semiconductor wafer to be reused is thinned whenever the wafer is reclaimed as described above, the whole thickness of the wafer for fabricating the semiconductor device is also thinned. Therefore, when the number of reuse increases, the thickness does not satisfy standard of the whole thickness of the wafer in the device fabrication, and thus the wafer cannot be used in a device fabrication process. There consequently arises a problem that the number of reuse of the wafer is limited.

CITATION LIST

Patent Literature

Patent Literature 1: Japanese Unexamined Patent Publication (Kokai) No. 9-312349

SUMMARY OF INVENTION

Technical Problem

The present invention was accomplished to solve the above-explained problems, and its object is to provide a semiconductor wafer having a multilayer film with the whole thickness satisfying the standard regardless of the number of reuse of the semiconductor wafer for delamination, when the method for forming the porous layer on the semiconductor wafer for delamination is adopted to produce the semiconductor wafer having a multilayer film for production of the semiconductor device.

Solution to Problem

To achieve this object, the present invention provides a method for producing a semiconductor wafer having a multilayer film, in production of a semiconductor device by the steps of forming a porous layer on a surface of a semiconductor wafer by changing a surface portion of the semiconductor wafer into the porous layer, forming a semiconductor film on a surface of the porous layer to produce the semiconductor wafer having a multilayer film, fabricating a device on the semiconductor film, and producing the semiconductor device by delaminating the semiconductor film along the porous layer, the semiconductor film having the device formed thereon; including at least: flattening a surface of a porous layer side of the semiconductor wafer after delaminating the semiconductor film having the device formed thereon, the porous layer being used for the delamination, and reusing the flattened semiconductor wafer as the semiconductor wafer for forming the porous layer to perform the steps of forming the porous layer and of forming the semiconductor film; the method further including a thickness adjusting step of adjusting a whole thickness of the semiconductor wafer having a multilayer film to be produced by reusing the semiconductor wafer so as to satisfy a predetermined standard.

The method for producing a semiconductor wafer having a multilayer film, including the above-described steps, in which the semiconductor wafer for delamination is reused, enables the semiconductor wafer having a multilayer film with the whole thickness satisfying the standard to be provided, regardless of the number of reuse of the semiconductor wafer for delamination.

In this case, the thickness adjusting can be performed by adjusting the thickness of the semiconductor film to be formed on the surface of the porous layer after forming the porous layer on the surface of the reused semiconductor wafer.

In this manner, when the thickness adjusting is performed by adjusting the thickness of the semiconductor film to be formed on the surface of the porous layer after forming the porous layer on the surface of the reused semiconductor wafer, the semiconductor wafer having a multilayer film with the whole thickness satisfying the standard can be provided.

Moreover, in this case, an area for etching removal is preferably provided in a porous layer side of the semiconductor film to be formed on the surface of the porous layer.

It is to be noted that the area for etching removal described herein is a layer of stock removal to be removed by etching after delamination in order to adjust the thickness of the semiconductor device to be fabricated. The thickness of the semiconductor device means a thickness of combination between an electrical active layer of the semiconductor device and a supporting layer to support the active layer with mechanical strength. The area for etching removal can be a predetermined thickness of the whole semiconductor film formed with a uniform layer. A layer having a higher etching rate than that of a layer that is to be left without etching removal is preferably formed as the area for etching removal.

In this manner, when the area for etching removal is provided in a porous layer side of the semiconductor film to be formed on the surface of the porous layer, the etching removal can be performed more rapidly and accurately.

Moreover, the thickness adjusting can be performed by forming an additional film on the surface of the reused semiconductor wafer after delaminating the semiconductor film having the device formed thereon.

In this case, the additional film can be formed on a surface on which the porous layer is to be formed of the reused semiconductor wafer. The additional film also can be formed on a surface opposite to a surface on which the porous layer is to be formed of the reused semiconductor wafer.

In this manner, the thickness of the semiconductor wafer having a multilayer film also can be adjusted by forming the additional film on the surface of the reused semiconductor wafer after delaminating the semiconductor film having the device formed thereon, and the semiconductor wafer having a multilayer film with the whole thickness satisfying the standard can be thereby provided. In addition, the additional film can be formed on either of a surface on which the porous layer is to be formed of the reused semiconductor wafer, and a surface opposite thereto.

Moreover, when the additional film is formed on the surface of the reused semiconductor wafer on an opposite side to the surface on a side of forming the porous layer, a polycrystalline film can be formed as the additional film.

In this manner, when the polycrystalline film is formed as the additional film on a back surface, it is low cost, and can serve as a gettering layer for contaminated materials such as metal impurities during heat treatment in a subsequent step of forming the device and the like.

Furthermore, the present invention provides a method for producing a semiconductor device, including the steps of: fabricating a device on the semiconductor film of the semiconductor wafer having a multilayer film produced by the method for producing a semiconductor wafer having a multilayer film according to any one of the above; and producing the semiconductor device by delaminating the semiconductor film along the porous layer, the semiconductor film having the device formed thereon.

In the above-described method for producing a semiconductor device, the semiconductor wafer having a multilayer film with the whole thickness satisfying the standard can be used, and the semiconductor device can be thereby produced without the limitation of the number of reuse.

Furthermore, the present invention provides a semiconductor wafer having a multilayer film for producing a semiconductor device, including a semiconductor wafer, a porous layer formed on a surface of the semiconductor wafer, and a semiconductor film formed on a surface of the porous layer, wherein the semiconductor film has an area for etching removal in a porous layer side.

The semiconductor wafer having a multilayer film in which the above-described area for etching removal is provided enables the semiconductor wafer having a multilayer film with the whole thickness satisfying the standard to be provided at low cost.

In this case, the wafer is highly useful for the case where a diameter of the semiconductor wafer is 450 mm or more.

In this manner, even when the semiconductor wafer has a large diameter of 450 mm or more, and the thickness of the wafer needs to be relatively thick because of a problem of wafer deflection due to an own weight, the semiconductor wafer for delamination can be repeatedly reused although the wafer is designed with a thickness that is thick enough to cope with the wafer deflection, and it can be low-cost.

Advantageous Effects of Invention

The method for producing a semiconductor wafer having a multilayer film according to the present invention enables the semiconductor wafer having a multilayer film with the whole thickness satisfying the standard to be provided, regardless of the number of reuse of the wafer for delamination, when the method for forming the porous layer on the semiconductor wafer for delamination is adopted to produce the semiconductor wafer having a multilayer film for production of the semiconductor device.

In addition, the method for producing a semiconductor device according to the present invention enables the semiconductor wafer having a multilayer film with the whole thickness satisfying the standard to be utilized, and thereby the semiconductor device to be produced without the limitation of the number of reuse.

In addition, the semiconductor wafer having a multilayer film according to the present invention enables the semiconductor wafer having a multilayer film with the whole thickness satisfying the standard to be provided at low cost.

BRIEF DESCRIPTION OF THE DRAWINGS

FIG. 2 is a flow chart showing an example of the method for adjusting the thickness of the semiconductor film in the method for producing a semiconductor wafer having a multilayer film according to the present invention;

DESCRIPTION OF EMBODIMENTS

Figure 1:
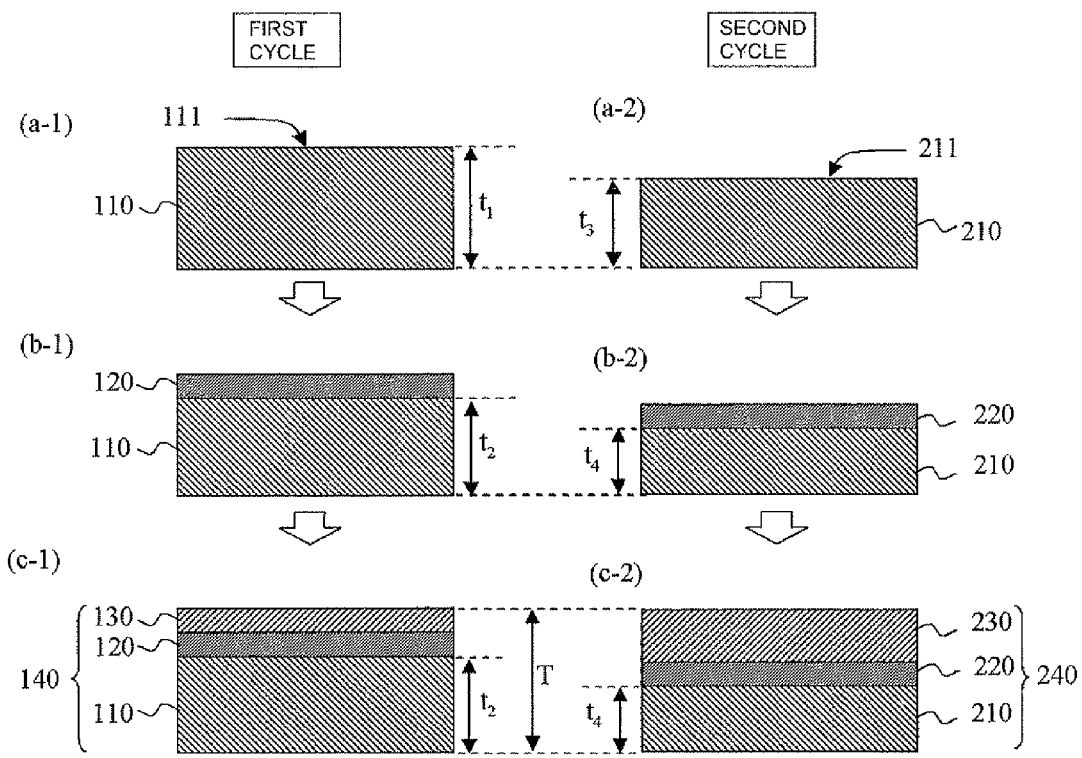
FIG. 1 is a flow chart showing an example of the method for producing a semiconductor wafer having a multilayer film according to the present invention.

Hereinafter, the present invention will be explained in detail. However, the present invention is not restricted thereto.

As described above, when the method for forming the porous layer on the semiconductor wafer surface is adopted, there is a problem that the thickness of the wafer gradually thins with an increase in the number of reuse.

That is, the porous layer formed for delamination needs to have a thickness of at least several microns. In addition to this, polishing of several microns is required for removing the porous layer left on the surface of the semiconductor wafer after delamination and performing a flattening processing of the wafer surface. The initial thickness of the semiconductor wafer is therefore thinned by at least approximately 10 µm by one reclaiming processing.

On the other hand, the standard (tolerance) of the wafer thickness, demanded from a wafer material by device makers to fabricate devices, is generally approximately ±15 µm, and even in case of a moderate standard due to the type of device to be fabricated, it is approximately ±25 µm. Therefore, even when taking advantage of the tolerance to the utmost, the number of reuse of the semiconductor wafer for delamination, allowed from the whole thickness of the wafer, is limited to 2 or 3 times or less in case of ±15 μm, and 3 or 4 times or less in case of ±25 μm.

A cost trial calculation by the present inventors proved as follows. It is not until the number of reuse is set to at least 3 times or more and preferably 5 times or more that a cost advantage is obtained sufficiently, in case of adopting the method for forming the porous layer, for example, by using a $p^+$-type silicon single crystal wafer.

The present inventors further conducted studies on the basis of this knowledge and conceived the following. When the method for forming the porous layer on the semiconductor wafer for delamination is adopted to produce the semiconductor wafer having a multilayer film for production of the semiconductor device, the semiconductor wafer having a multilayer film with the whole thickness satisfying the standard can be obtained, regardless of the number of reuse of the wafer for delamination by means of adjusting the whole thickness of the semiconductor wafer having a multilayer film to be produced by reusing the semiconductor wafer so as to satisfy a predetermined standard. In addition, the above-described semiconductor wafer having a multilayer film can be used in a device fabrication process regardless of the number of reuse, and thereby the production cost of the semiconductor wafer having a multilayer film and the fabrication cost of the device fabricated by using the semiconductor wafer having a multilayer film can be reduced. The present inventors thereby brought the present invention completion.

Hereinafter, the present invention will be explained in more detail with reference to the drawings. However, the present invention is not restricted thereto. In particular, there will be hereinafter described the case of using a p-type silicon single crystal wafer, which is favorable to use as the semiconductor wafer for delamination to be repeatedly used. However, the present invention is not restricted thereto, and can be applied to the other semiconductor wafers.

Figure 5:
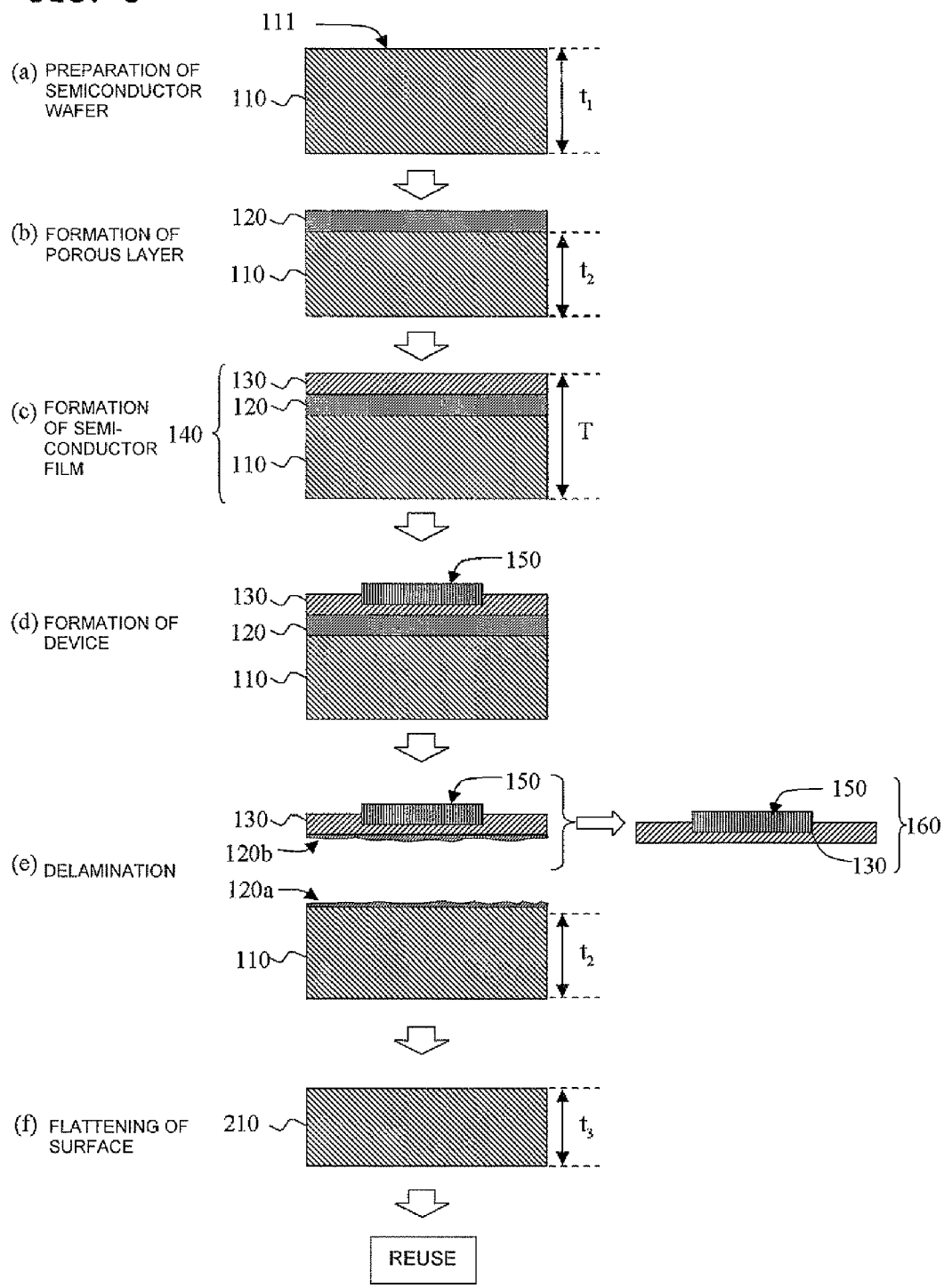
FIG. 5 is a flow chart showing an example of a reuse process of the semiconductor wafer, in which process the method for producing a semiconductor wafer having a multilayer film and the method for producing a semiconductor device according to the present invention can be applied.

FIG. 5 is a flow chart showing an example of a reuse process of the semiconductor wafer, in which process the present invention can be applied.

First, as shown in FIG. 5(a), a semiconductor wafer 110 is prepared for the first producing process prior to reuse (step a-1).

The semiconductor wafer 110 is not restricted in particular as long as the porous layer can be formed by changing the wafer surface portion into the porous layer, and as described above, the p-type silicon single crystal wafer is preferably used. In addition, the diameter of the wafer is not restricted in particular, and the present invention can be applied to particularly the wafer having a diameter of 450 mm or more.

The thickness $t_1$ of the semiconductor wafer 110 to be prepared is also not restricted in particular, and a normal standard wafer can be used.

Next, as shown in FIG. 5(b), the porous layer 120 is formed on the surface 111 of the semiconductor wafer 110 by changing the surface portion of the semiconductor wafer 110 into the porous layer (step b-1).

The porous layer 120 can be formed, for example, by an anodization method. The forming conditions (the porosity, thickness, and the like, of the porous layer 120) can be appropriately selected conveniently to the later-described delamination. For example, the porous layer 120 can be made to have a multilayer structure by forming the porous layer 120 in a multistage manner. The thickness of the porous layer 120 can be 1 to 10 μm, but is not restricted thereto.

At this point in time, the thickness $t_2$ of the semiconductor wafer 110 has been decreased by an amount of the change into the porous layer 120, from the thickness $t_1$ of the semiconductor wafer 110 prepared in the step a-1.

Moreover, although not shown in FIG. 5, a pretreatment to cover pores on the surface of the porous layer 120 can be performed before the later-described step of forming the semiconductor film 130 (pre-growth treatment-1).

When the pretreatment is performed, defects at the semiconductor film 130 can be preferably suppressed in the case of forming the semiconductor film 130 by epitaxial growth.

Next, as shown in FIG. 5(c), the semiconductor film 130 is formed on the surface of the porous layer 120 to produce the semiconductor wafer having a multilayer film 140 (step c-1).

The semiconductor film 130 can be formed which has various characteristics (the thickness, conductivity type, resistivity, and the like) suitable for the semiconductor device to be produced.

Moreover, the semiconductor film 130 can be formed, for example, by epitaxial growth. The conditions of the epitaxial growth can be appropriately selected.

The whole thickness of the semiconductor wafer having a multilayer film 140 produced at this point in time is referred as T.

Next, as shown in FIG. 5(d), the device 150 is formed on the semiconductor film 130 (step d-1).

Various types can be formed as the device 150, and it is not restricted in particular. For example, the present invention is suitable for the semiconductor device of which a microchip particularly has to be thinned, such as DRAM and NAND Flash which are developed for Multi-Chip-Package (MCP), a back illuminated device of an image pickup device as CCD/CIS, and a three-dimensional device, such as the combination between the image pickup device and memory, and the combination between an MPU and memory.

Next, as shown in FIG. 5(e), the semiconductor film 130 having the device 150 formed thereon is delaminated along the porous layer 120 to produce the semiconductor device 160 (step e-1).

Here, a method in which the delamination can be performed along the porous layer 120 can be adopted for the delamination. For example, the method for hitting jet water flow to the porous layer 120, and the method for delaminating in a mechanical manner can be adopted.

In this case, the side of the device 150 is preferably protected by attaching it to a substrate for temporary attachment (a quartz substrate etc.) through wax and the like. Alternatively, with ultraviolet (UV) cured resist instead of the wax, the side of the device 150 can be protected by resist curing, in which ultraviolet rays are radiated from the quartz substrate side after temporarily attaching it to the quartz substrate. Furthermore, in case of using an aqueous cured resist, an appropriate method can be adopted in which mechanical delamination other than the jet water flow is performed.

It is to be noted that a left film 120b of the porous layer is left on a back surface (the opposite side to the surface on a side of forming the device 150) of the semiconductor film 130 of the combination between the device 150 and semiconductor film 130 after the delamination, and can be selectively removed by etching. For example, mixed solution of $HF/HNO_3/CH_3COOH$ can be used as an etching solution.

The protection means such as the quartz substrate of the device 150 as described above is preferably removed after the etching removal of the left film 120b of the porous layer.

With regard to the semiconductor wafer 110 after the delaminating, as shown in FIG. 5(f), the surface of the porous layer (120) side (the left film 120a of the porous layer) used for the delamination is flattened (step f-1).

First, the porous layer 120a left on the surface as a left film is removed by etching and the like. The surface of the semiconductor wafer 110, where the porous layer 120 (the left film 120a of the porous layer) was formed, is thereafter polished again.

In this case, it is preferable that the back surface thereof (the surface on the opposite side to the surface where the porous layer was formed) is also polished. A double-side polishing apparatus may be used to polish both surfaces thereof simultaneously.

It is to be noted that the left film 120a of the porous layer can be removed by polishing in the same process as the polishing of the surface of the semiconductor wafer 110, instead of removing the left film 120a alone.

The semiconductor wafer 110 after the delamination is flattened to obtain the semiconductor wafer 210 as described above, and this is used as the semiconductor wafer to be reused.

At this point in time, the thickness $t_3$ of the semiconductor wafer 210 to be reused has been decreased by an amount of the flattening to reuse, from the thickness $t_2$ after forming the porous layer.

The semiconductor wafer 210 to be reused is again used as the semiconductor wafer for forming the porous layer in a process corresponding to FIG. 5(a) (step a-2).

The steps of forming the porous layer (step b-2) and forming the semiconductor film (step c-2) are again performed to produce the semiconductor wafer having a multilayer film again. In this case, the method according to the present invention includes the thickness adjusting step of adjusting the whole thickness of the semiconductor wafer having a multilayer film to be produced by reusing the semiconductor wafer 210 so as to satisfy a predetermined standard.

The first embodiment is shown in FIG. 1 as an example of a specific embodiment of the adjustment of the thickness of the semiconductor wafer having a multilayer film.

FIGS. 1(a-1), (b-1), and (c-1) are correspond to FIGS. 5 (a), (b), and (c) respectively, and show the first cycle (the first production process before reuse). On the other hand, FIGS. 1(a-2), (b-2), and (c-2) show the second cycle (the first production process reusing the semiconductor wafer).

As shown in FIG. 1(a-2), the semiconductor wafer 210 subjected to the flattening processing in the above-described step f-1 is reused as the semiconductor wafer for forming the porous layer again (step a-2).

At this point in time, the thickness of the semiconductor wafer 210 to be reused is decreased by an amount of the flattening to reuse, and it is $t_3$ as described above. That is, the thickness is decreased by $t_1$-$t_3$ in comparison with the semiconductor wafer 110 prepared first in the step a-1.

Next, as shown in FIG. 1(b-2), the surface 211 of the flattened semiconductor wafer 210 is changed into the porous layer to form the porous layer 220 (step b-2).

The porous layer 220 can be formed by the same method as the formation of the porous layer 120 in the step b-1. At this point in time, the thickness $t_4$ of the semiconductor wafer 210 is decreased by an amount of the change into the porous layer 220, from the thickness $t_3$ of the semiconductor wafer 210 prepared for reuse in the step a-2.

After forming the porous layer 220, the same pre-growth treatment process as the pre-growth treatment-1 performed before the first growth of semiconductor layer as described above can be performed (pre-growth treatment-2).

Next, as shown in FIG. 1(c-2), the semiconductor film 230 is formed on the surface of the porous layer 220 to produce the semiconductor wafer 240 having a multilayer film (step c-2). The semiconductor film 230 can be formed by the same method as the formation of the semiconductor film 130 in the step c-1. In this case, the thickness adjusting can be performed, in which the whole thickness of the semiconductor wafer 240 having a multilayer film is adjusted so as to satisfy a predetermined standard, by adjusting the thickness of the semiconductor film 230 to be formed on the surface of the porous layer 220.

The whole thickness of the reused semiconductor wafer 210 after the delamination at the step a-2 is decreased by $t_1$-$t_3$ (specifically, for example, at least approximately ten and several microns, as describe above) in comparison with the semiconductor wafer 110 prepared first in the step a-1, and therefore the variation of the thickness of the produced semiconductor wafer having a multilayer film, namely the change in the thickness between the semiconductor wafer having a multilayer film 140 produced in the first cycle and the semiconductor 240 wafer having a multilayer film produced in the second cycle, can be reduced by forming the semiconductor film 230 thickly so as to compensate the decrease of the semiconductor wafer.

It is to be noted that a permissible range (tolerance) of the variation of the thickness varies according to the device to be formed, and the thickness is going to proceed the permissible range in course of time by repeatedly reclaiming without the thickness adjusting.

An example of a method for adjusting the thickness of the semiconductor film 230 is shown in FIG. 2.

FIG. 2(c-2) corresponds to FIG. 1(c-2), and shows the semiconductor wafer 240 having a multilayer film produced by forming the semiconductor film 230 having a thickness increased by $t_1$-$t_3$ on the surface of the porous layer 220 (step c-2).

With regard to the semiconductor wafer 240 having a multilayer film, as shown in FIG. 2(d-2), the device 250 is formed on the semiconductor film 230 by the same method as the step d-1 (FIG. 5(d)) (step d-2).

Next, as shown in FIG. 2(e-2), the semiconductor film 230 having the device 250 formed thereon is delaminated along the porous layer 220 by the same method as the step e-1 (FIG. 5(e)) to produce the semiconductor device 260 (step e-2).

Incidentally, since the thickness of the semiconductor film 230 to be formed in the step c-2 is determined according to the type of device to be formed, inconvenience for device fabrication may be caused by forming the semiconductor film 230 having a thickness increased by $t_1$-$t_3$ (for example, approximately ten and several microns) in comparison with the semiconductor film 130 of the first cycle as described above. However, in case of targeted semiconductor devices of the present invention, the delamination is performed after forming the device on the semiconductor film, and after the delamination, the thickness can be thereby adjusted as needed by etching removal of a delamination side of the semiconductor film 230 together with the left film 220b of the porous layer (the semiconductor device 260' shown in FIG. 2(g-2)).

With regard to the semiconductor wafer 210 after the delaminating, as shown in FIG. 2(f-2), the surface of the porous layer (220) side (the left film 220a of the porous layer) used for the delamination is flattened (step f-2) by the same method as the step f-1 (FIG. 5(f)) to obtain the semiconductor wafer 310, and this is used as the semiconductor wafer 310 to be reused.

The third cycle or later can be also carried out by repeating the above-described cycle, and thus the semiconductor wafer after delamination can be reused to produce the semiconductor wafer having a multilayer film and the semiconductor device respectively.

It is to be noted that the semiconductor film is formed mainly by epitaxial growth, and when the semiconductor film is thickly formed to reduce the variation of the thickness of the semiconductor wafer having a multilayer film as described above, an increase in cost of the epitaxial growth is concerned. However, the thickness of mainly targeted semiconductor devices of the present invention is the semiconductor film having a thickness of, for example, approximately 20 to 100 µm, which includes a supporting layer for supporting the active layer with mechanical strength. Since a rate of the epitaxial growth at the time of depositing the semiconductor film is several microns per minute or more, even when an extra thickness of ten and several microns to several tens of microns is deposited, reaction time of the epitaxial growth is extended for a few minutes only, and thus the increase in cost of the epitaxial growth is not so large.

Next, another example of a method for adjusting the thickness of the semiconductor film 230 in the second cycle will be explained.

Figure 3:
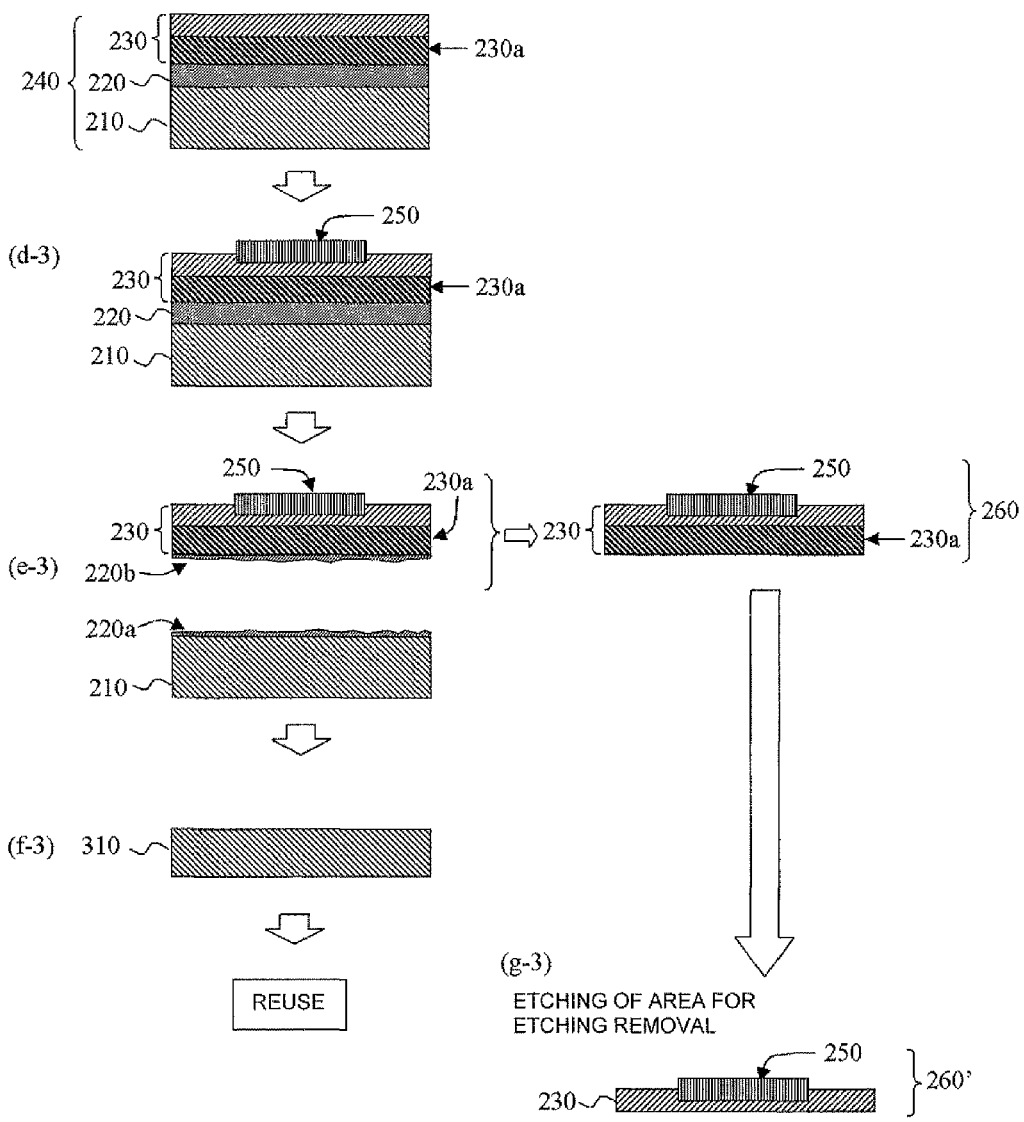
FIG. 3 is a flow chart showing another example of the method for adjusting the thickness of the semiconductor film in the method for producing a semiconductor wafer having a multilayer film according to the present invention.

FIG. 3 shows another example of the method for adjusting the thickness of the semiconductor film 230.

FIGS. 3(c-3) to (g-3) correspond to FIGS. 2(c-2) to (g-2) respectively.

As shown in FIG. 3(c-3), the thickness is adjusted by providing with the area for etching removal 230a on the porous layer (220) side of the semiconductor film 230 to be formed on the surface of the porous layer 220.

It is to be noted that the area for etching removal 230a described herein is a layer of stock removal to be removed by etching after the delamination in order to adjust the thickness of the semiconductor device to be produced. The area for etching removal can be a predetermined thickness of the whole semiconductor film formed with a uniform layer. A layer having a higher etching rate than that of a layer that is to be left without etching removal is preferably formed as the area for etching removal 230a.

As described above, when the area for etching removal is provided in the porous layer side of the semiconductor film to be formed on the surface of the porous layer, the etching removal can be performed more rapidly and accurately to obtain the semiconductor device 260'.

For example, when $p^+$ layer (approximately a resistivity of 0.01 Ωcm) is formed as the area for etching removal 230a, and $p^-$ layer (a layer of low concentration dopant, approximately a resistivity of 10 Ωcm) is formed as the layer that is to be left without etching removal, the $p^+$ layer can be selectively removed by etching with selective etching solution that has a higher etching rate with a higher impurity concentration, for example, 1-3-8 etching solution (mixed acid of HF (hydrogen fluoride):$HNO_3$ (nitric acid):$CH_3COOH$ (acetic acid)=1:3:8) (Japanese Unexamined Patent Publication (Kokai) No. 8-139297).

The above-described semiconductor wafer 240 having a multilayer film, provided with the area for etching removal 230a in the porous layer (220) side of the semiconductor film 230 enables the semiconductor wafer having a multilayer film with the whole thickness satisfying the standard to be provided at low cost.

Next, the second embodiment will be explained with reference to FIG. 4 as another example of the method for producing a semiconductor wafer having a multilayer film according to the present invention.

Figure 4:
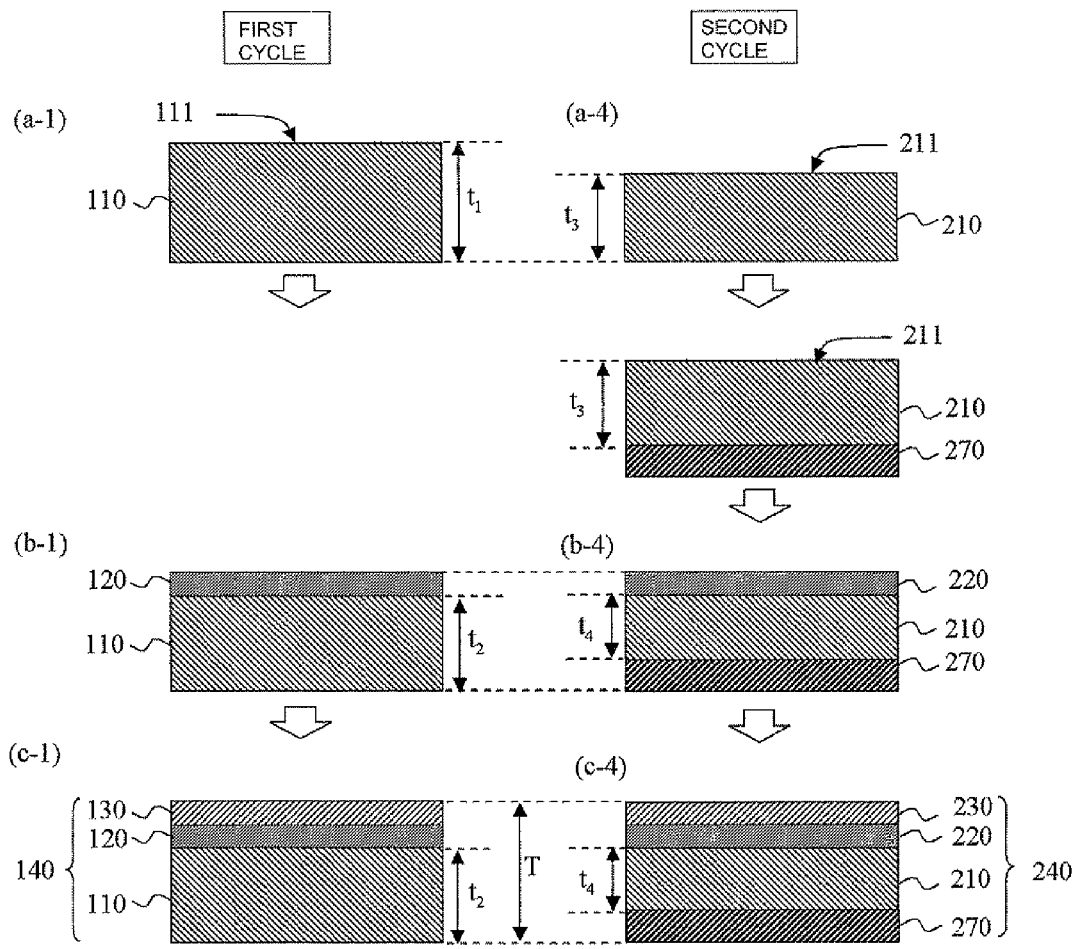
FIG. 4 is a flow chart showing another example of the method for producing a semiconductor wafer having a multilayer film according to the present invention.

In this embodiment, the whole thickness of the semiconductor wafer 240 having a multilayer film is adjusted so as to satisfy a predetermined standard by forming the additional film 270 on the surface on the opposite side to the surface 211 of the reused semiconductor wafer 210 (refer to FIG. 4(a-4)) on the side of forming the porous layer 220, in the second cycle. The thickness of the additional film 270 can be $t_1$-$t_3$.

The material of the additional film 270 on the back surface can be the same as the semiconductor wafer 210 to be reused, a material in which dopant concentration is changed, and a polycrystalline film. When the polycrystalline film is formed as the additional film 270 on the back surface, it can be formed at low-cost, and preferably can serve as the gettering layer for contaminated materials such as metal impurities during heat treatment in a subsequent step of forming the device and the like.

Thereafter, as shown in FIGS. 4(b-4) and (c-4), the semiconductor wafer 240 having a multilayer film with a thickness T can be obtained by forming the porous layer 220 (step b-4) and forming the semiconductor film 230 (step c-4).

Moreover, the whole thickness of the semiconductor wafer 240 having a multilayer film can be adjusted so as to satisfy a predetermined standard by forming the additional film on the surface on the opposite side to the surface on the side of forming the porous layer, also in the third cycle or later.

It is to be noted that hereinbefore the case of performing the thickness adjusting by forming the additional film on the wafer back surface whenever the semiconductor wafer is reused (every one cycle), but the thickness adjusting may be performed in such a manner that the thickness decreased by reusing several times is adjusted at a time. This preferably makes the cost reduction effect easier to obtain.

Next, the third embodiment will be explained with reference to FIG. 6 as another example of the method for producing a semiconductor wafer having a multilayer film according to the present invention.

Figure 6:
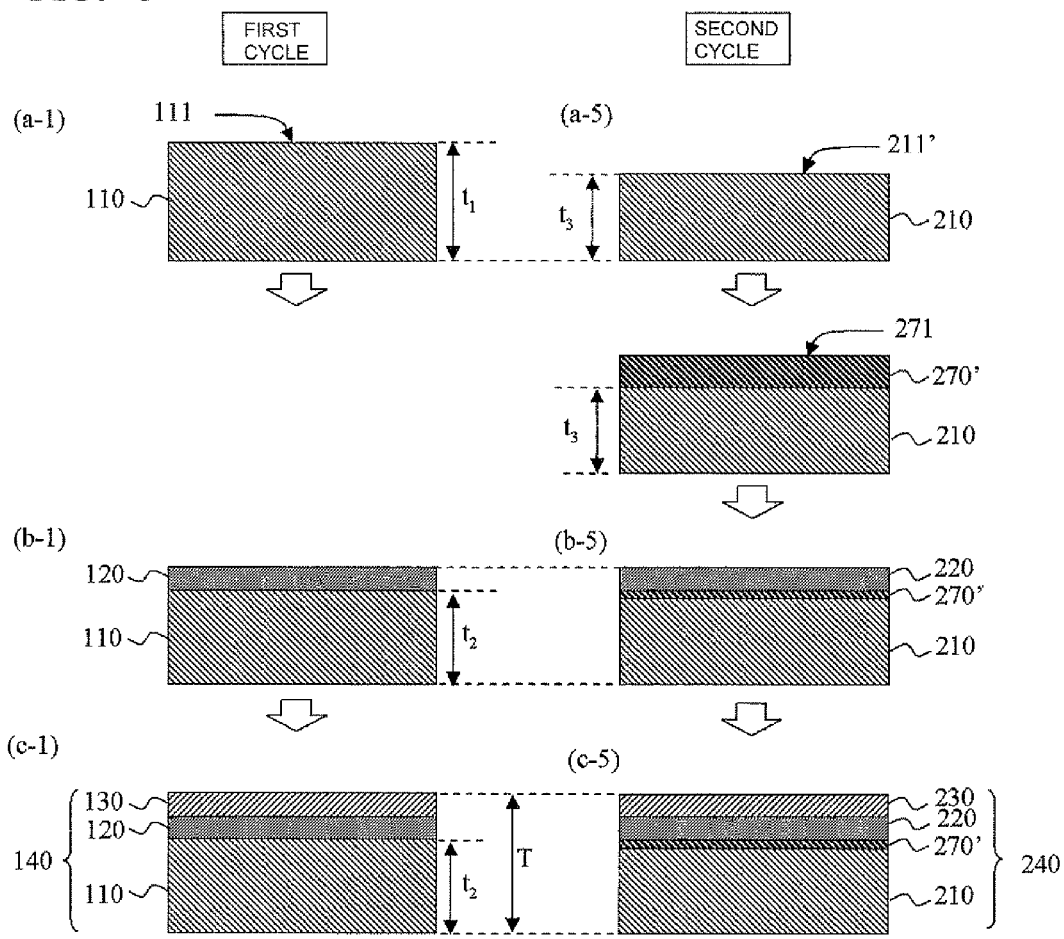
FIG. 6 is a flow chart showing yet another example of the method for producing a semiconductor wafer having a multilayer film according to the present invention.

In this embodiment, the whole thickness of the semiconductor wafer 240 having a multilayer film is adjusted so as to satisfy a predetermined standard by forming the additional film 270' on the surface 211' of the reused semiconductor wafer 210 (refer to FIG. 6(a-5)) on the side of forming the porous layer 220, in the second cycle. The thickness of the additional film 270' can be, for example, $t_1$-$t_3$.

It is to be noted that, in this embodiment, the additional film 270' needs to be composed of a material capable of changing into the porous layer, and forms the semiconductor wafer by unifying with the semiconductor wafer 210 to be reused. In this case, the conductivity type, resistivity, and the like of the additional film 270' are not necessarily same as the semiconductor wafer 210 to be reused, and can be appropriately adjusted.

Next, as shown in FIG. 6(b-5), the surface portion (that is, the surface portion of the semiconductor wafer) of the additional film 270', in which the additional film 270' forms the semiconductor wafer by unifying with the semiconductor wafer 210 to be reused, is changed into the porous layer to form the porous layer 220 on the surface 271 of the additional film 270' (step b-5).

It is to be noted that FIG. 6(b-5) shows the case where a part of the additional film 270' is left, but the present invention is not restricted thereto. For example, a part of the reused semiconductor wafer 210 can be changed into the porous layer.

Thereafter, as shown in FIG. 6(c-5), the semiconductor film 230 is formed on the surface of the porous layer 220 to obtain the semiconductor wafer 240 having a multilayer film with a thickness T (step c-5).

Moreover, the whole thickness of the semiconductor wafer 240 having a multilayer film is adjusted so as to satisfy a predetermined standard by forming the additional film on the surface of the reused semiconductor wafer on the side of forming the porous layer, also in the third cycle or later.

It is to be noted that also in the case of forming the additional film on the surface of the reused semiconductor wafer on the side of forming the porous layer, whenever the semiconductor wafer is reused (every one cycle), the thickness adjusting may be performed by forming the additional film. Alternatively, the thickness adjusting may be performed in such a manner that the thickness decreased by reusing several times is adjusted at a time. When the thickness adjusting is performed in such a manner that the thickness decreased by reusing several times is adjusted at a time, as described above, the cost reduction effect is preferably made easier to be obtained.

The wafer having a diameter of 450 mm, which is developed as the next generation of a silicon single crystal wafer having a diameter of 300 mm, or the semiconductor wafer having a large diameter more than 450 mm can be preferably used in the present invention.

This semiconductor wafer having a large diameter rises a problem of wafer deflection due to an own weight. In a trial calculation, for example, the thickness of the semiconductor wafer having a diameter of 450 mm needs to be approximately 1.5 to 2 mm or more to suppress the defects sufficiently. In the semiconductor wafer having a large diameter, which needs to have the above-described thickness, a conventional usage that the wafer is used up in each device fabrication causes a problem of higher material cost.

However, even when the wafer thickness needs to satisfy a standard of a greatly thick thickness than a conventional case in order to suppress the wafer deflection and the like, the method for reusing the semiconductor wafer according to the present invention enables the semiconductor wafer for delamination with a thickness capable of satisfying the standard to be reused many times, and thus the cost can be reduced.

EXAMPLE

Hereinafter, the present invention will be explained in more detail with reference to Example. However, the present invention is not restricted thereto.

Example

The semiconductor wafer having a multilayer film and the semiconductor device were produced on the basis of the method for producing a semiconductor wafer having a multilayer film and method for producing a semiconductor device according to the present invention shown in FIGS. 1, 3, and 5, respectively.

This will be explained with reference to FIG. 5.

First, as shown in FIG. 5($a$) and FIG. 1($a$-1), there was prepared, as the semiconductor wafer 110, a silicon single crystal wafer having conditions of p-type, a crystal orientation of the main surface of (100), a diameter of 300 mm, double-side polishing, a thickness $t_1$=745 μm, a resistivity of 0.01 to 0.02 Ωcm (step a-1).

Next, as shown in FIG. 5($b$) and FIG. 1($b$-1), the porous layer 120 was formed on one surface 111 of the semiconductor wafer 110 by changing one main surface portion of the semiconductor wafer 110 into the porous layer by using the two-stage anodization (step b-1).

The conditions of the first anodization were as follows.
Solution: 49% $HF:H_2O$:99% $C_2H_5OH$=1:1:1
Electric current: 7 mA/cm$^2$
Time: 5 minutes
Temperature: room temperature As a result, the porous layer having a porosity of 18% and a film thickness of 5 μm was formed.

The conditions of the second anodization were as follows.
Solution: 49% $HF:H_2O$:99% $C_2H_5OH$=1:1:1
Electric current: 30 mA/cm$^2$
Time: 1.5 minutes
Temperature: room temperature As a result, the porous layer having a porosity of 50% and a film thickness of 4 μm was formed.

That is, the whole thickness of the porous layer 120 was 9 μm. At this point in time, the thickness $t_2$ of the semiconductor wafer 110 was therefore approximately 736 μm.

Next, for purpose of suppressing defects at the epitaxial layer (the semiconductor film 130) to be grown on the porous layer 120 by covering the pores on the surface of the porous layer 120, the following treatment was performed as the pre-treatment before the epitaxial growth (formation of the semiconductor film 130) (pre-growth treatment-1).

First, sidewall oxidation of the pores of the porous layer 120 was performed under oxide atmosphere at 400° C. for 1 hour. Next, an oxide film on the surface (the surface and an area having a depth of approximately 1 μm) of the porous layer 120 was etched with hydrofluoric acid (HF solution). Next, pre-bake was performed under hydrogen atmosphere at 950° C. Hydrogen gas-bake was performed with a rare Si gas contained.

Next, as shown in FIG. 5($c$) and FIG. 1($c$-1), the semiconductor film 130 was formed on the surface of the porous layer 120 by the epitaxial growth as follows (step c-1).

The conditions of the epitaxial growth were a atmosphere gas of SiHCl$_3$ (trichlorosilane)/H$_2$, a temperature of 1150° C., a dopant of boron, and a growth rate of 3 μm/minute.

The thickness of the semiconductor film 130 after the epitaxial growth was 30 μm, the conductivity type and resistivity of the semiconductor film 130 were p-type and 10 Ωcm, respectively. The whole thickness T of the wafer (the semiconductor wafer having a multilayer film 140) after the epitaxial growth was 775 μm.

Next, as shown in FIG. 5($d$), a dummy COD device was formed on the semiconductor film 130 as the device 150 (step d-1).

Next, as shown in FIG. 5($e$), the semiconductor wafer 110 and the semiconductor film 130 having the device 150 formed thereon were separated by performing the delamination along the porous layer 120 as follows (step e-1).

Specifically, after the surface of the device 150 was covered with wax, it was attached to a quartz substrate for temporary attachment. Thereafter, it was delaminated by hitting jet water flow to the porous layer 120.

The temporarily-attached quartz substrate of the combination between the device 150 and semiconductor film 130 after the delamination was removed by removing the wax. The left film 120$b$ of the porous layer on the back surface (the opposite side to the surface where the device 150 was formed) was removed by etching with the mixed solution of HF/HNO$_3$/CH$_3$COOH as an etching solution, and thereby the semiconductor device 160 was obtained.

With regard to the semiconductor wafer 110 after the delamination, first, the porous layer 120$a$ left on the surface as the left film was removed by etching with the etching solution of HF/HNO$_3$/CH$_3$COOH. The surface of the semiconductor wafer 110 on the side where the porous layer was formed, was thereafter polished again (step f-1). The back surface thereof (the surface on the opposite side to the surface on the side where the porous layer was formed) was also polished. The semiconductor wafer to be reused (a reclaiming wafer) 210 was obtained by these processing for reuse. It is to be noted that total stock removal for reclaiming, including the back surface was 5 μm.

The thickness $t_3$ of the semiconductor wafer 210 to be reused subjected to the flattening processing was 731 μm. That is, the thickness was decreased by 14 μm from that of the former semiconductor wafer 110. The detail of each thickness was as follows.

> 775 μm(the thickness T of the semiconductor wafer having a multilayer film 140)−30 μm(the thickness of the semiconductor film 130 epitaxially-grown)−9 μm(the thickness of the change into the porous layer 120)−5 μm(the stock removal for reuse)=731 μm($t_3$)

The semiconductor wafer 210 subjected to the flattening processing was prepared to be used as the semiconductor wafer for forming the porous layer again (refer to FIG. 1(*a*-2), step a-2).

Next, as shown in FIG. 1(*b*-2), the surface 211 of the semiconductor wafer 210 subjected to the flattening processing was changed into the porous layer by anodization to form the porous layer 220 (step b-2).

The second formation of the porous layer 220 was performed in the same conditions as the first formation of the porous layer (step b-1). The thickness of the porous layer 220 was 9 μm, and at this point in time, the thickness $t_4$ of the semiconductor wafer 210 was approximately 722 μm.

Next, the pre-growth treatment was performed in the same conditions as the pre-growth treatment-1 performed before the first growth of the semiconductor layer as described above (pre-growth treatment-2).

Next, as shown in FIG. 3(*c*-3), the semiconductor film 230 was formed on the surface of the porous layer 220 by the epitaxial growth as follows (step c-3). Here, as shown in FIG. 3(*c*-3), the area for etching removal 230*a* was provided on the porous layer (220) side of the semiconductor film 230.

Specifically, the semiconductor film 230 was formed by two-stage epitaxial growth, in which the conditions were changed each, as follows.
(The Epitaxial Growth in the First Stage)
The conditions of the epitaxial growth were a atmosphere gas of $SiHCl_3$ (trichlorosilane)/$H_2$, a temperature of 1150° C., a dopant of boron, and a growth rate of 3 μm/minute.

The growth time and dopant concentration were set so that the thickness of a first epitaxial layer (corresponding to the area for etching removal 230*a*) was 14 μm (that is, this corresponds to an amount of decrease in the whole thickness of the reclaiming wafer 210 from the former semiconductor wafer 110), and the conductivity type was p-type, the resistivity was 0.012 Ωcm ($p^+$ layer, that is, a high concentration dopant).
(The Epitaxial Growth in the Second Stage)
The atmosphere gas, a growth temperature of 1150° C., the dopant type, the growth rate were the same as the epitaxial growth in the first stage respectively, and the growth time and dopant concentration were set so that the conductivity type was p-type, the resistivity was 10 Ωcm. The thickness of the semiconductor layer by the epitaxial growth was 30 μm, and the whole thickness of the wafer (the semiconductor wafer 240 having a multilayer film) after the epitaxial growth was 775 μm (the same as the thickness T of the semiconductor wafer having a multilayer film 140 at the first cycle).

Next, as shown in FIG. 3(*d*-3), a dummy CCD device was formed on the semiconductor film 230 as the device 250 (step d-3) as with step d-1.

Next, as shown in FIG. 3(*e*-3), after protecting the surface of the device 250 by the wax and quartz substrate for temporary attachment, the semiconductor wafer 210 and the semiconductor film 230 having the device 250 formed thereon, delaminated by hitting jet water flow to the porous layer 220, were separated by the same method as the step e-1 (step e-3).

Next, with regard to the device 250 and semiconductor film 230 after the delamination, before removing the wax on the device 250 and the temporarily-attached quartz substrate, the left film 220*b* of the porous layer was removed by etching to obtain the semiconductor device 260, and the area for etching removal 230*a* ($p^+$ layer having a thickness of 14 μm) was removed with selective etching solution (49% HF:61% $HNO_3$:99% $CH_3COOH$=1:3:8 (1-3-8 etching solution)).

The wax on the device 250 and the temporarily-attached quartz substrate were thereafter removed to obtain the semiconductor device 260' in which the area for etching removal 230*a* was removed.

On the other hand, with regard to the semiconductor wafer 210 after the delaminating, as shown in FIG. 3(*f*-3), the porous layer 220*a* left on the surface as the left film was removed by etching, both surfaces thereof were polished to be obtain the semiconductor wafer 310 to be reused by the same method as the step f-1 (step f-3).

As a result of repeating the above-described cycle several times, there were no problems of the quality of the produced semiconductor device and the produced semiconductor wafer having a multilayer film in each cycle, and the semiconductor device and semiconductor wafer having a multilayer film were produced at low cost, respectively.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:
1. A method for producing a semiconductor wafer having a multilayer film, in production of a semiconductor device by the steps of forming a porous layer on a surface of a semiconductor wafer by changing a surface portion of the semiconductor wafer into the porous layer, forming a semiconductor film on a surface of the porous layer to produce the semiconductor wafer having a multilayer film, fabricating a device on the semiconductor film, and producing the semiconductor device by delaminating the semiconductor film along the porous layer, the semiconductor film having the device formed thereon; comprising at least:
   flattening a surface of a porous layer side of the semiconductor wafer after delaminating the semiconductor film having the device formed thereon, the porous layer being used for the delamination, and
   reusing the flattened semiconductor wafer as the semiconductor wafer for forming the porous layer to perform the steps of forming the porous layer and of forming the semiconductor film;
   the method further comprising a thickness adjusting step of adjusting a whole thickness of the semiconductor wafer having a multilayer film to be produced by reusing the semiconductor wafer so as to satisfy a predetermined standard, wherein
   a number of reuse for the flattened semiconductor wafer is set to at least 3 times or more, and
   the thickness adjusting is performed by adjusting a thickness of the semiconductor film to be formed on the surface of the porous layer only after forming the porous layer on the surface of the reused semiconductor wafer.

2. The method for producing a semiconductor wafer having a multilayer film according to claim 1, wherein an area for etching removal is provided in a porous layer side of the semiconductor film to be formed on the surface of the porous layer.

3. A method for producing a semiconductor device, comprising the steps of:
   fabricating a device on the semiconductor film of the semiconductor wafer having a multilayer film produced by the method for producing a semiconductor wafer having a multilayer film according to claim 1; and
   producing the semiconductor device by delaminating the semiconductor film along the porous layer, the semiconductor film having the device formed thereon.

4. A method for producing a semiconductor device, comprising the steps of:
   fabricating a device on the semiconductor film of the semiconductor wafer having a multilayer film produced by the method for producing a semiconductor wafer having a multilayer film according to claim 3; and
   producing the semiconductor device by delaminating the semiconductor film along the porous layer, the semiconductor film having the device formed thereon.

5. The method for producing a semiconductor wafer having a multilayer film according to claim 1, wherein the number of reuse for the flattened semiconductor wafer is set to at least 5 times or more.

* * * * *